United States Patent [19]

Wang

[11] Patent Number: 5,604,155
[45] Date of Patent: Feb. 18, 1997

[54] AL-BASED CONTACT FORMATION PROCESS USING TI GLUE LAYER TO PREVENT NODULE-INDUCED BRIDGING

[75] Inventor: Kuang-Chih Wang, Taichung Hsien, Taiwan

[73] Assignee: Winbond Electronics Corp., Hsinchu, Taiwan

[21] Appl. No.: 503,286

[22] Filed: Jul. 17, 1995

[51] Int. Cl.$^6$ .................................................. H01L 21/283
[52] U.S. Cl. ........................... 437/190; 437/192; 437/194
[58] Field of Search ............................... 437/189, 190, 437/192, 194; 257/751, 752, 753, 763

[56] References Cited

U.S. PATENT DOCUMENTS

| | | | |
|---|---|---|---|
| 4,980,301 | 12/1990 | Harrus et al. | 437/12 |
| 5,208,472 | 5/1993 | Su et al. | 257/344 |
| 5,240,880 | 8/1993 | Hindman et al. | 437/190 |
| 5,288,665 | 2/1994 | Nulman | 437/194 |
| 5,290,731 | 3/1994 | Sugano et al. | 437/174 |
| 5,356,836 | 10/1994 | Chen et al. | 437/194 |
| 5,427,666 | 6/1995 | Mueller et al. | 204/192.17 |

OTHER PUBLICATIONS

"A Highly Reliable Multilevel Interconnection Process for 0.6 μm CMOS Devices", Y. Takata et al., VMIC, Jun. 1991, pp. 13–19.

"Planarized Aluminum Metallization for Sub–0.5 μm CMOS Technology", F. S. Chen et al., IDEM 1990, pp. 51–52, Dec. 1990.

Primary Examiner—T. N. Quach
Attorney, Agent, or Firm—Meltzer, Lippe, Goldstein, et al.

[57] ABSTRACT

A contact metallization process which includes a Ti glue layer has been disclosed. The Ti glue layer is formed between a barrier metal layer and an Al-based layer. The Ti glue layer prevents formation of etch resistant precipitants in or on the Al-based layer. The Ti glue layer reacts with the aluminum based layer to form $TiAl_3$ which dissolves the precipitates. The inventive process allows proper etching of the Al-based layer and eliminates bridging.

3 Claims, 3 Drawing Sheets

AL-BASED CONTACT FORMATION PROCESS USING TI GLUE LAYER TO PREVENT NODULE-INDUCED BRIDGING

RELATED APPLICATIONS

The following patent applications are assigned to the assignee hereof and contain subject matter related to the subject matter of the present patent application:

1. U.S. patent application Ser. No. 08/454,031, entitled "Aluminum Planarization Using In-Situ Ti/TiN/Al Metallization", filed on May 30, 1995, for Kuang-Chih WANG and Jing-Hua CHIANG.

2. U.S. patent application Ser. No. 08/432,026, entitled "In-Situ Pre-PECVD Oxide Deposition Process For Treating SOG", filed on May 1, 1995, for Chin-Hao CHOU, Yu-Chen YANG and Shing-Hsiang HUNG.

FIELD OF THE INVENTION

The present invention relates to a process for forming a contact on a semiconductor device, especially a MOSFET device having sub-micron dimensions.

BACKGROUND OF THE INVENTION

A conventional MOS device with sub-micron dimensions is illustrated in FIG. 1. Illustratively, the device 10 is formed in a P-well region 12 of an N-type silicon substrate. $N^+$-type source and drain regions 14 and 16 are formed in the P-well 12. Field oxide (FOX) regions 15, 17, which are relatively thick oxide regions, separate the device 10 from adjacent devices formed on the substrate. The gate 18 is made from polysilicon. The gate 18 is separated from the P-well surface by the thin gate oxide 19 and is enclosed by the dielectric 20 which also may be oxide. The device 10 is covered by a pre-metal dielectric layer 30. The layer 30 is illustratively a dual stack of TEOS (Tetra-Ethyl-Ortho-Silicate) based USG/BPSG (Undoped Silicon Glass/Boro-Phospho-silicate Glass) with a thickness of 3000–5000 Angstroms. The layer 30 is formed by low pressure chemical vapor deposition (LPCVD) or atmospheric pressure chemical vapor deposition (APCVD).

The subject of the present invention is the formation of the metal contacts to the source and drain regions 14 and 16. These contacts are formed by etching the dielectric layer 30 to form the openings 40. The etching involves two steps, a BHF wet etch followed by anisotropic dry etch, in which steps the dielectric 30 is 40% and 60% etched, respectively. After the contact openings 40 are first formed, a reflow step is used to round the tops of the contact openings. Typically, the contact aspect ratio (depth/width)is about 1.8.

Then, the metal contacts 50 are formed in the openings 40 according to a so-called metal (I) process. A variety of processes have been suggested in the prior art for the metal (I) process and these are reviewed below. In general, the metal (I) process is used to form metal (I) contacts 50 which fill the contact openings 40. However, in order to interconnect devices formed on the surface of the same substrate, it is necessary to form vias which extend horizontally on the substrate surface (not shown in FIG. 1). To form the vias, an inter-metal dielectric involving a PECVD/SOG/PECVD (Plasma Enhanced Chemical Vapor Deposition/Spin-On-Glass/Plasma Enhanced Chemical Vapor Deposition) sandwich is formed on the substrate surface. Openings for the vias are then etched in the inter-metal dielectric. Then, the via openings are filled with metal using a metal (II) process.

In a MOSFET device with sub-micron dimensions, sub-micron metallization has been formed using the conventional W(tungsten)-CVD plug process. The W-CVD plug process has been in existence at several large device manufacturing facilities (see Y. Takata et al VMIC 1991, p. 13). The W-CVD plug process has been successfully used for multilevel interconnection.

However, the W-CVD plug process has a number of significant disadvantages. It is a high cost process and requires additional process steps. It also requires a more planarized surface topography owing to the subsequent process of residue free tungsten etchback.

Instead of using the tungsten plug process to form metallization, an Al-based metallization process may be used. The advantages of an aluminum based metallization process are that a well understood material is used, there is a simpler process sequence, and a perceived lower cost.

The conventional aluminum process for forming the metal (I) contact may be understood in connection with FIG. 2. A conventional sputtering machine is used.

The steps for forming the metal (I) contact 50 in the opening 40 are as follows:

(1) Buffer Oxide Etch (BOE) to remove native oxide from contact openings of the wafer;

(2) in the sputtering machine, grow a layer of Ti with a thickness of about 400 Å in the contact openings;

(3) in the sputtering machine, grow a layer of TiN with a thickness of about 1000 Å in the contact opening; (The sputtering steps (2) and (3) take place in a vacuum maintained in a chamber of the sputtering machine. The vacuum is $10^{-5}$ to $10^{-8}$ Torr. The Ti layer is labeled 52 in FIG. 2 and the TiN layer is labeled 54.)

(4) The wafer is removed from the sputtering chamber and exposed to air;

(5) The wafer is annealed at a temperature of about 450 degrees for about 30 minutes;

(6) The wafer is then returned to the sputtering machine and an aluminum based layer with a thickness of 4500–10,000 Angstroms is deposited by sputtering at a temperature of about 300° C. (The aluminum based layer is labeled 56 in FIG. 2.) The aluminum based layer 56 may be an Al-Si-Cu alloy or other Al-based alloy. As shown in FIG. 1, the aluminum based layer 56 is then etched to form the metal contacts 50 over the source and drain regions 14, 16.

(7) The wafer is then moved to another chamber and a TiN layer (not shown in FIG. 2) is deposited by sputtering with a thickness of about 400 Angstroms to serve as a anti-reflection coating (ARC).

Then the inter-metal dielectric (IMD) layers are formed. The wafer than goes to X-ray lithography to pattern the IMD to form via openings for the vias formed by a metal (II) process.

The purpose of the Ti/TiN layers is to prevent aluminum from diffusing into the silicon substrate. The Ti/TiN layers thus serve as a barrier for aluminum diffusion. If the Ti/TiN barrier is not good enough and aluminum diffuses through the barrier into the silicon substrate, there will be junction leakage and device failure. The purpose of the vacuum break and anneal steps is to fill the grain boundaries of the Ti/TiN layers so that the aluminum and silicon do not diffuse together in the subsequent aluminum deposition step.

An important problem with the conventional Al/Si/Cu metallization process is poor Al step coverage. A higher Al/Si/Cu deposition temperature, such as 450° C., is used to overcome the poor Al step coverage. However, a significant problem with the conventional high temperature Al/Si/Cu metallization process is the precipitation of silicon nodules that resist etching as the Al/Si/Cu layer is cooled to room temperature. This is due to the high solubility of Si in Al at high temperatures, but low solubility of Si in Al at low temperatures. Referring to FIGS. 1 and 2, the etch resistant silicon nodules, which precipitate in the aluminum based layer 56 and on its surface, prevent etching and removal of the aluminum based layer 56 from the surface of the dielectric layer 30 located between the two metal contacts 50. Therefore, the precipitated silicon nodules cause device failure due to metal bridging or shorting between the two contacts 50 of the source and drain regions 14, 16.

Accordingly, it is an object of the invention to provide an Al-based contact formation process which overcomes the shortcomings of the prior art.

In particular, it is an object of the invention, to provide an Al-based contact formation process which is useful in sub-micron device geometries, and which prevents the formation of silicon nodule precipitates that resist etching.

SUMMARY OF THE INVENTION

A novel Al-based contact formation process for a sub-micron semiconductor device is proposed. A Ti glue layer is formed between a barrier metal layer and an Al-based layer. The Ti glue layer prevents formation of etch resistant precipitants in the Al-based layer. The inventive process allows proper etching of the Al-based layer and eliminates bridging or shorting between the source and drain contacts. (The inventive contact formation process is useful for multilevel metallizations (metal (I) and metal (II)). In contrast to the conventional Al-based contact formation process, there is no bridging of the Al-based contact and no degradation in junction leakage current or $N^+$ or $P^+$ contact resistance. There is also improved electromigration resistance.

DETAILED DESCRIPTION OF THE INVENTION

Figure 1:
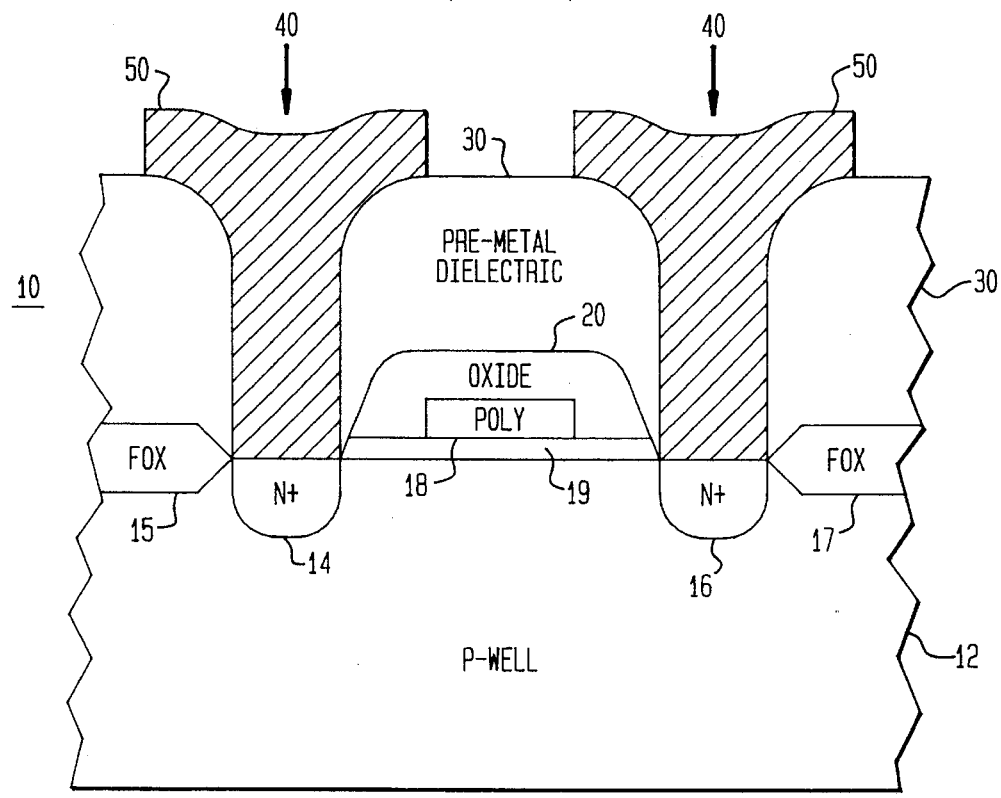
FIG. 1 schematically illustrates a conventional MOSFET device.
Figure 2:
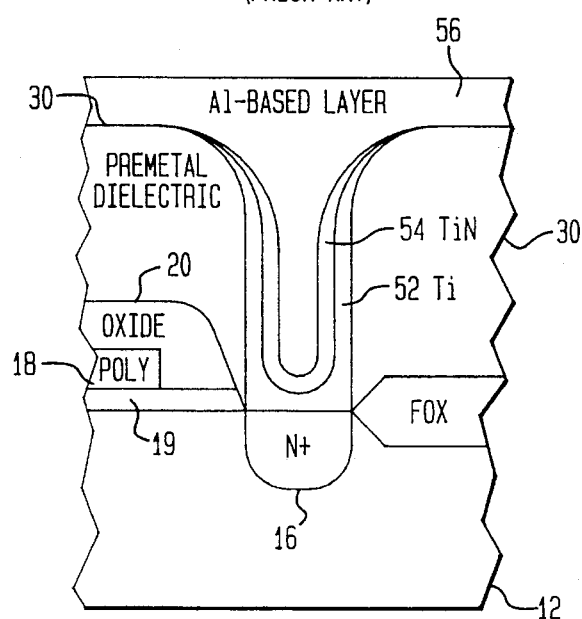
FIG. 2 schematically illustrates a metal contact formed using a conventional Al-based metallization process.
Figure 3:
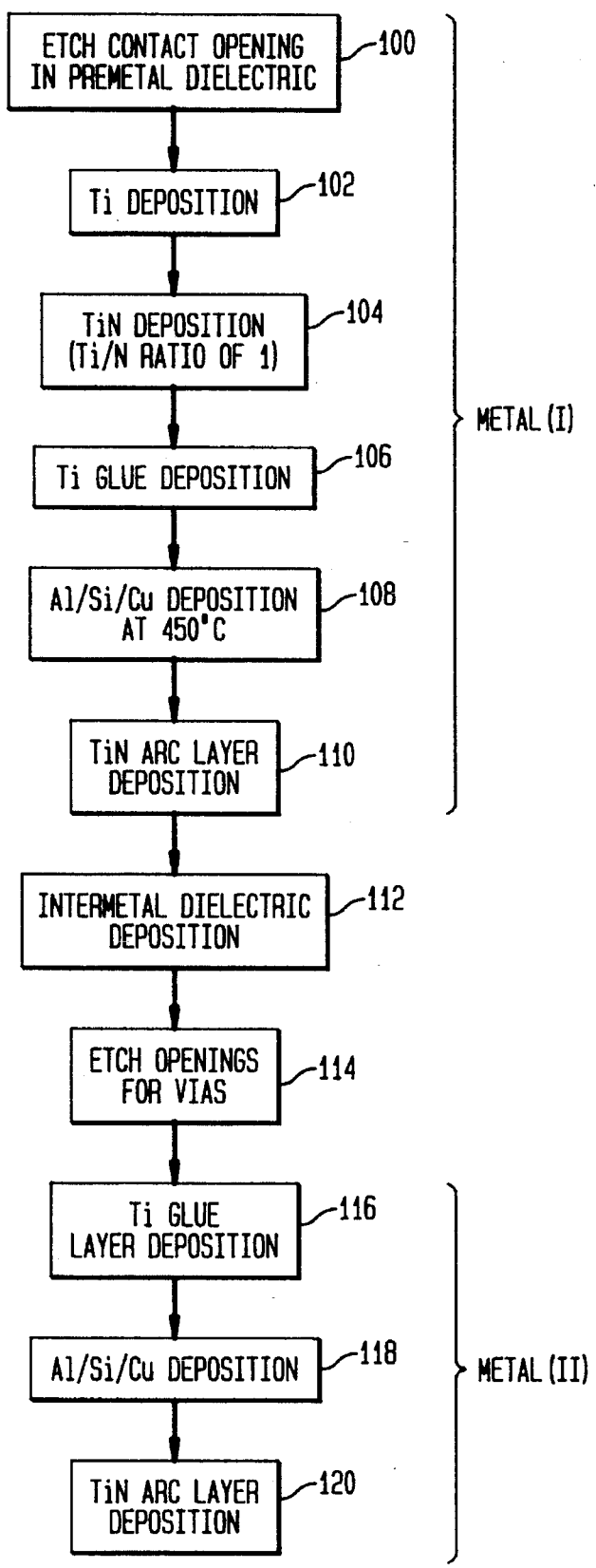
FIG. 3 is a flow diagram which illustrates an Al-based metallization process according to the invention.
Figure 4:
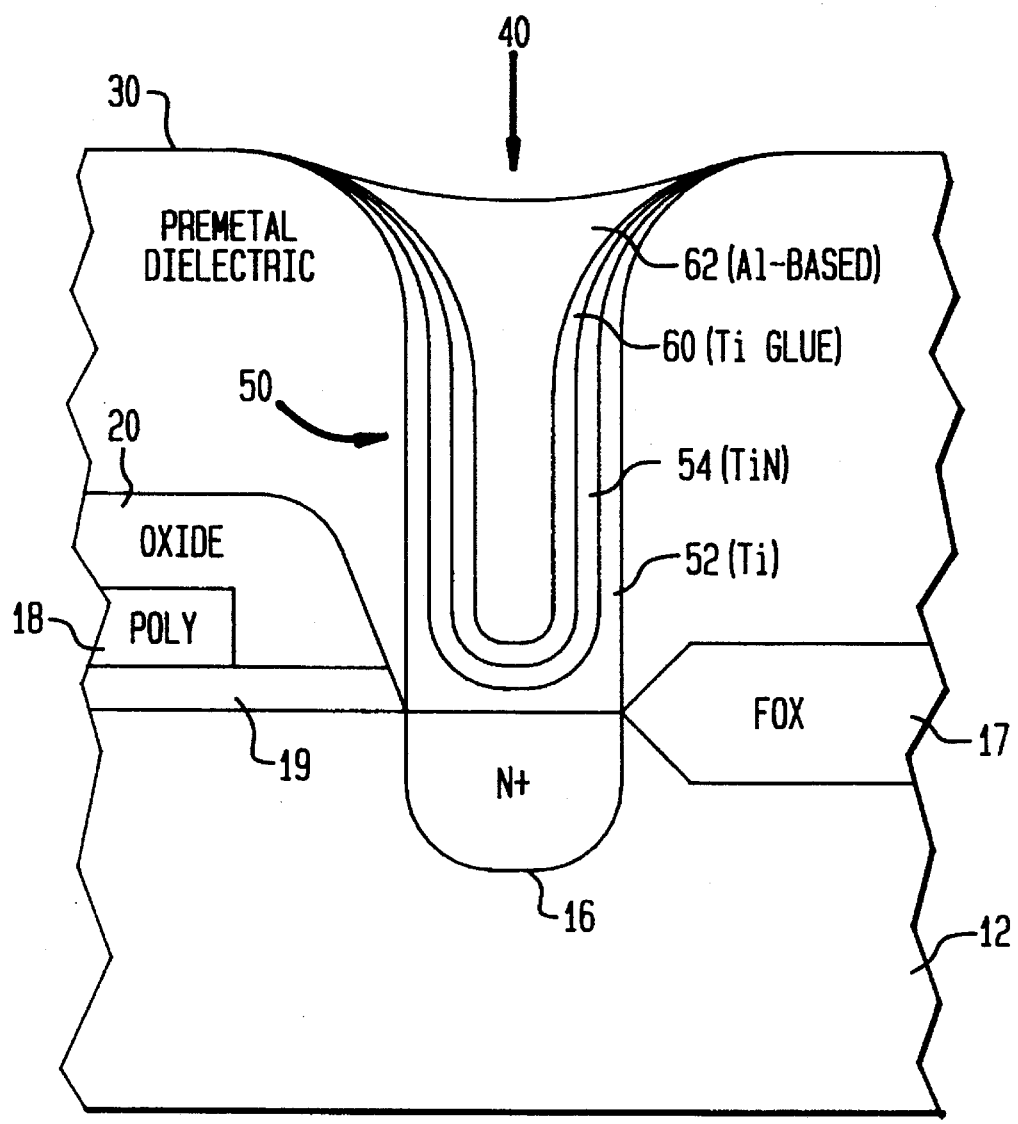
FIG. 4 schematically illustrates a metal contact formed according to the invention.

FIG. 3 shows the process steps used to form metallization for an MOS device according to the invention. A resulting metal (I) contact 50 is shown in FIG. 4.

The pre-metal dielectric 30 is etched to form the contact opening 40 (step 100 in FIG. 3). The pre-metal dielectric includes a dual-layer stack of TEOS based USG/BPSG with 300 nm/500 nm thickness respectively. The contact etching includes two steps, BHF wet etch followed by anisotropic dry etch. After the contact openings 40 are formed, the structure is subjected to a reflow step to round the top of the contact openings 40. The contact aspect ratio is about 1.8.

The Varian M2000/8 cluster PVD system is illustratively used for the metallization deposition. The following layers are sputter deposited in a vacuum chamber sequentially without breaking the vacuum and without requiring any intervening annealing:

(1) deposit Ti refractory barrier metal layer 52 with thickness of 40 nm (FIG. 3, step 102). It is desirable that the Ti barrier be sufficient to lower the contact resistance.

(2) deposit TiN barrier metal layer 54 with thickness of 100 nm. (FIG. 3, step 104). The Ti/TiN deposition takes place in the vacuum chamber at 150° for 80 seconds. It is desirable that the TiN barrier be sufficient to prevent the diffusion of Al into the Si substrate. One preferred way to achieve this is to make the Ti/N ratio in the TiN barrier metal layer 54 to be about one. The TiN barrier layer 54 having a ratio of one apparently has a stronger diffusion resistance than Ti rich TiN film.

(3) deposit a Ti glue layer 60 with a thickness of 400 Å. (FIG. 3, step 106). The Ti glue layer deposition takes place in the vacuum chamber at a temperature of 150° C. for 15 seconds.

(4) deposit an Al-based layer 62 in a different sputtering chamber than the sputtering chamber used for Ti/TiN deposition (FIG. 3, step 108). Illustratively, the Al-based layer is made of an Al/Si/Cu alloy having 98.5% Al, 1% Si and 0.5% Cu. The Al/Si/Cu layer 62 is deposited at 450° C. by sputtering. This elevated temperature increases the surface diffusion energy of aluminum atoms so that the aluminum can fill into the contact opening 40 with no void as well as planarize the contact hole. Thus, as shown in FIG. 4, the sputtering at the elevated temperature allows the Al-based layer 62 to completely fill the contact opening 40 with good planarization at the top.

The Ti glue layer 60 is sufficient to react with the Al in the Al/Si/Cu layer 62 to form $TiAl_3$. The Ti glue layer 60 prevents formation of silicon nodules by dissolving the Si nodules that precipitate from the Al/Si/Cu layer 62 in the $TiAl_3$. This eliminates Si precipitants which resist etching, allows good metal etching of the Al/Si/Cu layer 62, and prevents bridging.

(5) Next, TiN ARC (anti-reflection coating) layer is deposited (step 110 of FIG. 3, not shown in FIG. 4).

This completes the metal (I) deposition process.

Steps 112, 114, 116, 118, and 120 of FIG. 3 relate to the metal (II) deposition process. According to step 112, an inter-metal dielectric (IMD) is then deposited on the substrate. The inter-metal dielectric is a PECVD/SOG/PECVD sandwich structure. The siloxane SOG material is used to achieve IMD planarization. The via holes are opened (step 114) by BHF wet etch and anisotropic dry etch. Then the metal (II) is deposited with the sequence of a Ti glue layer (step 116), an Al/Si/Cu layer (step 118) and a TiN ARC (step 120). The aluminum deposition temperature in the metal (II) process can be lower than the aluminum deposition temperature in the metal (I) process due to the looser aspect ratio in the via level. The lower temperature of aluminum is also helpful for preventing SOG from out-gassing.

After the metal (II) process is complete, conventional device passivation layers are deposited.

In short, a method for forming the contact metallization for a sub-micron MOS integrated circuit has been disclosed. The inventive technique eliminates Si precipitants which resist etching, allows good metal etching of the Al/Si/Cu layer 62, and prevents bridging. The inventive process shows no bridging and degradation in contact resistance in comparison to the conventional process. Moreover, there is no degradation in device yield.

Finally, the above-described embodiments of the invention are intended to be illustrative only. Numerous alternative embodiments may be devised by those skilled in the art without departing from the spirit and scope of the following claims.

I claim:

1. A method for forming a planarized aluminum contact metallization in a MOS structure on a silicon substrate, the method comprising the steps of:

(a) forming a contact opening in a pre-metal dielectric which has previously been formed on said substrate;

(b) depositing a Ti metal layer in said contact opening and in contact with said substrate by sputtering in a first chamber;

(c) depositing a TiN barrier metal layer on said first Ti metal layer by sputtering in said first chamber;

(d) depositing a Ti glue layer over said TiN barrier metal layer by sputtering in said first chamber;

(e) depositing a first aluminum based layer on said Ti glue layer by sputtering in a second chamber, said steps (b), (c), (d) and (e) taking place sequentially without breaking a vacuum maintained in said first and second chambers, said first aluminum based layer being formed at a sufficiently elevated temperature so that said aluminum layer substantially fills said contact opening and is planarized, said TiN barrier layer resisting the diffusion of aluminum into said substrate while said aluminum based layer is being deposited at said elevated temperature, and said Ti glue layer being sufficient to prevent formation of precipitates in and on said first aluminum based layer by reacting with said first aluminum based layer to form $TiAl_3$ which dissolves said precipitates;

(f) forming a first TiN antireflection coating layer on said first aluminum based layer;

(g) depositing an intermetal dielectric layer over said antireflection coating layer;

(h) etching an opening for a via in said intermetal dielectric layer;

(i) depositing a second Ti glue layer in said via opening;

(j) depositing a second aluminum based layer over said second Ti glue layer in said via, said second aluminum based layer being deposited at a sufficiently elevated temperature so that said via opening is filled and said second aluminum based layer is planarized; and (k) forming a second TiN antireflection coating layer on said second aluminum based layer.

2. The method of claim 1 wherein said TiN barrier metal layer has a Ti/N ratio of about 1.

3. The method of claim 1 wherein said second aluminum based layer is deposited at a lower temperature than said first aluminum based layer.

* * * * *